United States Patent
Hsu

(10) Patent No.: US 7,629,204 B2
(45) Date of Patent: Dec. 8, 2009

(54) SURFACE ROUGHENING METHOD FOR EMBEDDED SEMICONDUCTOR CHIP STRUCTURE

(75) Inventor: Shih-Ping Hsu, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 449 days.

(21) Appl. No.: 11/432,369

(22) Filed: May 12, 2006

(65) Prior Publication Data

US 2006/0263936 A1 Nov. 23, 2006

(30) Foreign Application Priority Data

May 9, 2005 (TW) .............................. 94114850 A

(51) Int. Cl.
*H01L 21/00* (2006.01)
(52) U.S. Cl. .................. 438/125; 438/964; 438/121; 438/122; 257/E21.499
(58) Field of Classification Search ................. 438/121, 438/122, 125, 964
See application file for complete search history.

(56) References Cited

U.S. PATENT DOCUMENTS

| | | | | |
|---|---|---|---|---|
| 4,294,651 A | * | 10/1981 | Ohmura | 438/750 |
| 5,223,081 A | * | 6/1993 | Doan | 438/703 |
| 5,554,569 A | * | 9/1996 | Ganesan et al. | 29/827 |
| 5,773,362 A | * | 6/1998 | Tonti et al. | 438/665 |
| 6,040,629 A | * | 3/2000 | Shimizu et al. | 257/770 |
| 6,184,064 B1 | * | 2/2001 | Jiang et al. | 438/113 |
| 6,248,612 B1 | * | 6/2001 | Castro et al. | 438/106 |
| 6,444,498 B1 | * | 9/2002 | Huang et al. | 438/126 |
| 6,689,641 B2 | * | 2/2004 | Ohta et al. | 438/121 |
| 6,699,731 B2 | * | 3/2004 | Huang et al. | 438/108 |
| 7,109,067 B2 | * | 9/2006 | Kobayashi | 438/126 |
| 7,134,195 B2 | * | 11/2006 | Sunohara et al. | 29/832 |
| 7,250,327 B2 | * | 7/2007 | Sakamoto | 438/106 |
| 7,312,108 B2 | * | 12/2007 | Zhao et al. | 438/125 |
| 7,364,944 B2 | * | 4/2008 | Huang et al. | 438/108 |
| 2004/0014317 A1 | * | 1/2004 | Sakamoto et al. | 438/689 |

* cited by examiner

*Primary Examiner*—David A Zarneke
(74) *Attorney, Agent, or Firm*—Birch, Stewart, Kolasch & Birch, LLP

(57) ABSTRACT

A surface roughening method for an embedded semiconductor chip structure is proposed. The method includes providing a carrier board with an opening and mounting a semiconductor chip in the opening of the carrier board, the semiconductor chip having a plurality of electrode pads; and performing a surface roughening process on a surface of the electrode pads of the semiconductor chip, so as to form a rough structure on a surface of the semiconductor chip exposed by the opening of the carrier board. Thus, adhesion between the chip and a dielectric layer is improved during subsequently forming circuit build-up layers on the roughened surface of the semiconductor chip and on the surface of carrier board.

13 Claims, 4 Drawing Sheets

SURFACE ROUGHENING METHOD FOR EMBEDDED SEMICONDUCTOR CHIP STRUCTURE

BACKGROUND OF THE INVENTION

1. Field of the Invention

The present invention relates generally to a surface roughening method for an embedded semiconductor chip structure, and more particularly to a method for roughening a surface of a semiconductor chip which is stably mounted to a carrier board.

2. Description of Related Art

Referring to FIG. 1, a conventional embedded semiconductor chip package structure is shown. The package structure comprises: a heat spreader 102 having at least a recess portion 104; a semiconductor chip 114 mounted in the recess portion 104 via its non-active surface 118 by an adhesive layer 120; and a circuit structure 122 formed on the heat spreader 102 and the semiconductor chip 114.

Since no surface roughening method is adopted in the above package structure, de-lamination is easy to occur to the semiconductor chip 114 mounted in a substrate. To solve this problem, a surface roughening process such as a micro-etch process is usually performed on a die comprising a plurality of semiconductor chips. Thereby, a plurality of semiconductor chips with rough surface structure can be obtained. Afterwards, a cutting process can be performed to separate the plurality of the semiconductor chips from each other. Then, one of the semiconductor chips having the roughed structure can be mounted to the beat spreader 102 to increase the bonding force between the semiconductor chip and the circuit structure.

However, while roughening surface of the plurality of semiconductor chips of a die by a micro-etch process, the roughened surface of the semiconductor chips often becomes uneven because the die immerged in an etching solution is large in size or too many dies are immerged in the etching solution. In addition, since the surface roughening process is generally performed after the die has been thinned, such problems as die break and die scratch are easy to occur to such a thinned die. Furthermore, it needs long time to separate a semiconductor chip having rough surface structure from a die and mount it to a heat spreader, and accordingly the rough surface of the semiconductor chip may be oxidized, which adversely affects the reliability of a subsequent process.

SUMMARY OF THE INVENTION

Accordingly, it is an objective of the present invention to provide a surface roughening method for an embedded semiconductor chip structure, through which a uniformly rough structure can be formed on a surface of the embedded semiconductor chip.

It is another objective of the present invention to provide a surface roughening method for an embedded semiconductor chip structure, through which a subsequent fabricating process can be performed directly on the roughened surface of the semiconductor chip so as to avoid oxidization of the roughened surface.

A further objective of the present invention is to provide a surface roughening method for an embedded semiconductor chip structure, which can increase fabrication throughput and improve product yield.

In order to attain the objectives mentioned above and the others, a surface roughening method for an embedded semiconductor chip structure according to a first embodiment of the present invention comprises the steps of: providing a carrier board with an opening, a semiconductor chip being mounted in the opening of the carrier board; and performing a surface roughening process on a surface of the semiconductor chip, so as to form a rough structure on the surface of the semiconductor chip exposed by the opening of the carrier board.

In another embodiment of the present invention, a surface roughening method for an embedded semiconductor chip structure comprises the steps of: providing a carrier board with an opening, a semiconductor chip being mounted in the opening of the carrier board; and performing a surface roughening process on a surface of the semiconductor chip and a surface of the carrier board, so as to form a rough structure on the surface of the semiconductor chip exposed by the opening of the carrier board and on the surface of the carrier board.

The surface roughening method according to the previous embodiments of the present invention can be selectively applied on the surface of the semiconductor chip or on both the surface of the semiconductor chip and the surface of the carrier board. After performing the surface roughening process, a circuit build-up process can be performed on the roughened surface of the semiconductor chip and the carrier board.

Furthermore, the surface roughening process can be selectively applied on an active surface and/or a non-active surface of the semiconductor chip, and the carrier board can be one of a metal board, a circuit board or a dielectric board.

According to the present invention, because the surface roughening process is performed after the semiconductor chip is stably mounted to the carrier board, a uniformly rough structure can be achieved on surface of the semiconductor chip. Meanwhile, the conventional problems such as chip surface oxidization, die break and die scratch can be prevented. Further, since a circuit build-up process can be directly performed on the rough structure, the fabrication throughput is increased and the product yield is improved.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification. The present invention can also be performed or applied by other different embodiments. The details of the specification may be on the basis of different points and applications, and numerous modifications and variations can be devised without departing from the spirit of the present invention.

Figure 1:
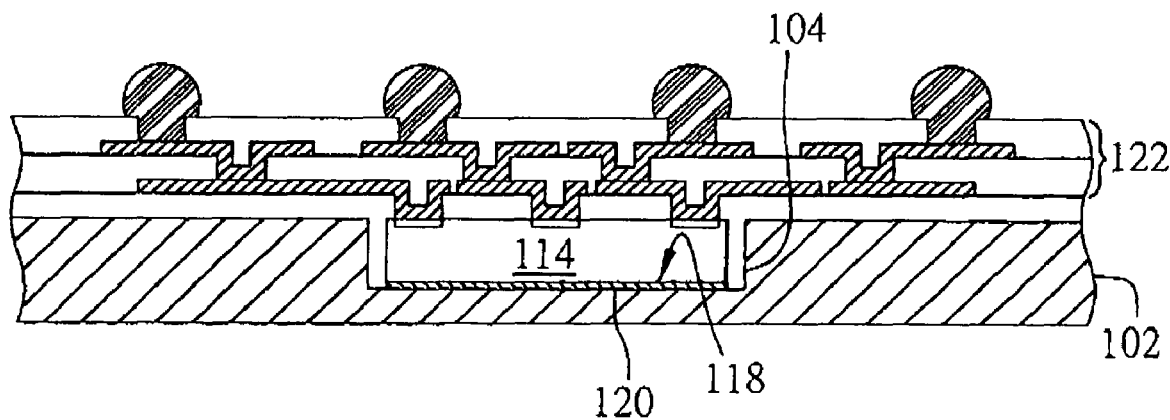
FIG. 1 is a sectional diagram showing a conventional embedded semiconductor chip package structure.
Figure 2A:
FIGS. 2A to 2C are sectional diagrams showing a surface roughening method for an embedded semiconductor chip structure according to a first embodiment of the present invention.
Figure 2B:
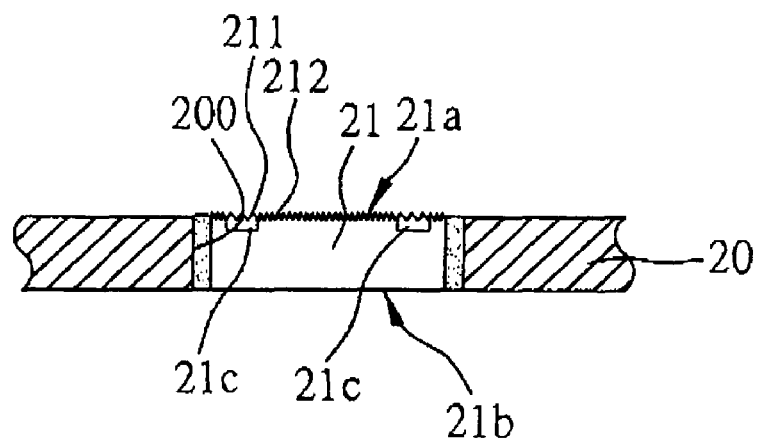
Figure 2C:
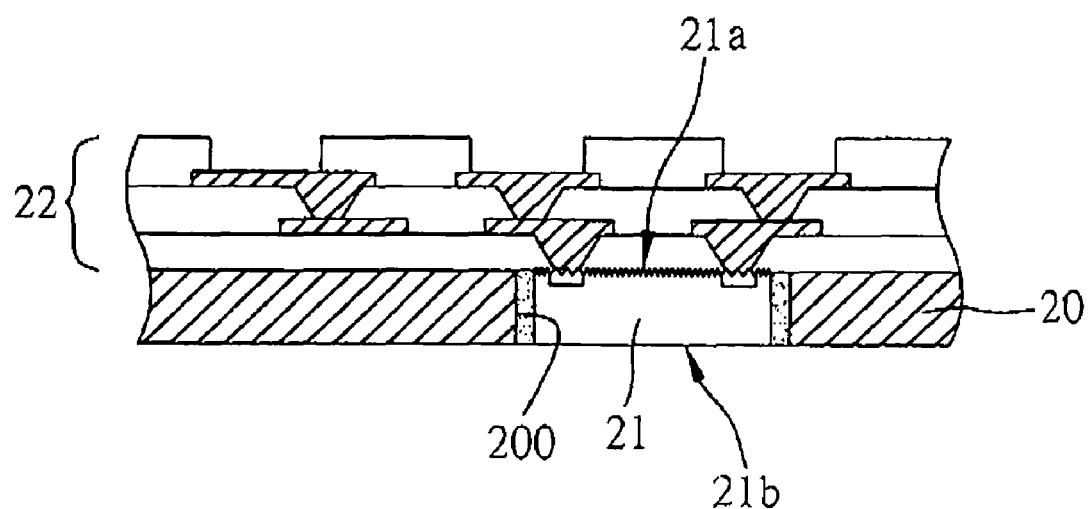

FIGS. 2A to 2C show a surface roughening method for an embedded semiconductor chip structure according to a first embodiment of the present invention.

Referring to FIG. 2A, a carrier board 20 with an opening 200 is provided. The carrier board 20 can be a dielectric board, a metal board or a circuit board of a single-layer or multi-layer structure. The opening 200 can be a through hole penetrating through the carrier board 20. Alternatively, the opening 200 can have a recess structure without penetrating through the carrier board 20.

Referring to FIG. 2B, a semiconductor chip 21 having an active surface 21a and a non-active surface 21b is mounted in the opening 200 of the carrier board 20 with its active surface 21a exposed from the opening 200 of the carrier board 20. Therein, the active surface 21a of the semiconductor chip 21 has a plurality of electrode pads 21c. Afterwards, different surface roughening processes are performed at different areas of the active surface 21a of the semiconductor chip 21, wherein, the surface 211 of the electrode pads 21c is roughened through an oxide process, a brown oxide process or a micro-etch process. The area 212 outside the electrode pads 21c such as passivation layer of the semiconductor chip 21 is roughened through a plasma etching process, a plasma desmearing process or a reactive ion etching process. Thereby, different rough structures are formed on the semiconductor chip 21.

In the present embodiment, the semiconductor chip 21 is roughened through a micro-etch process by using an etching solution comprising $H_2SO_4$ and $H_2O_2$ such that a rough structure can be formed on surface of the semiconductor chip 21 corresponding to the opening 200 of the carrier board 20. Preferably, the depth of the rough structure is ranged between 0.2 μm and 2.5 μm.

Referring to FIG. 2C, a circuit build-up structure 22 is formed on surfaces of the carrier board 20 and the active surface 21a of the semiconductor chip 21, wherein the roughened surface of the active surface 21a provides a preferred bonding force between the active surface 21a and the circuit build-up structure 22.

It should be noted that the non-active surface 21b of the semiconductor chip 21 can also be roughened if a circuit or dielectric layer build-up structure needs to be formed on the non-active surface 21b. In addition, the semiconductor chip 21 can be partially received by the opening 200 of the carrier board 20 so as to increase the roughening surface of the semiconductor chip 21. Furthermore, the etching solution is not limited to the above mentioned solution. The etching solution can be such as an acidic solution, a basic solution or an acidic-basic solution.

Therefore, through the above surface roughening process on surface of a semiconductor chip mounted to a carrier board, a uniformly rough structure can be formed on the surface of the semiconductor chip. Thus, a circuit build-up process can directly be performed on the uniformly rough structure so as to increase fabrication throughput and improve product yield. Also, the conventional problems such as die break, die scratch and rough surface oxidization are prevented.

Figure 3A:
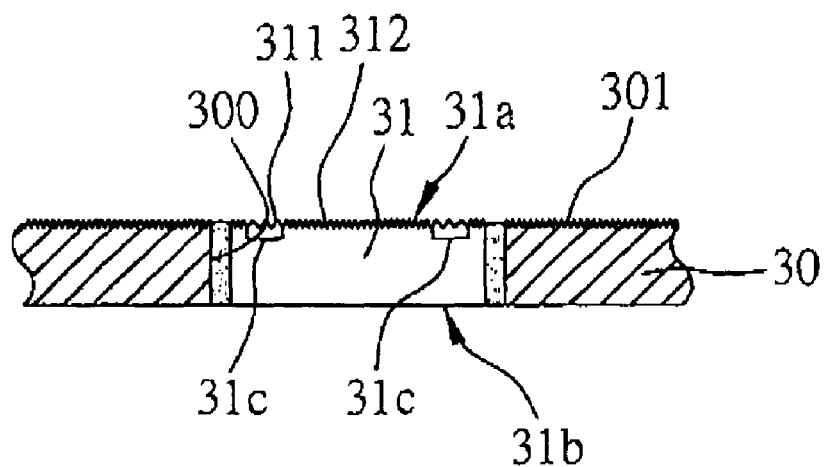
FIGS. 3A and 3B are sectional diagrams showing a surface roughening method for an embedded semiconductor chip structure according to a second embodiment of the present invention.
Figure 3B:
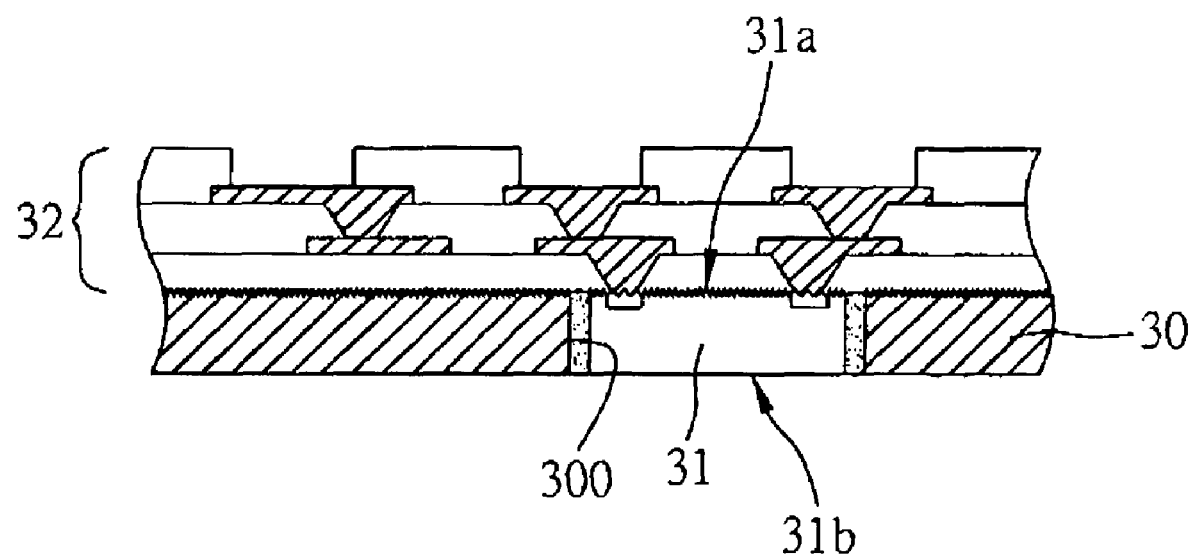

FIGS. 3A and 3B show a surface roughening method for an embedded semiconductor chip structure according to a second embodiment of the present invention. In the present embodiment, not only the surface of the semiconductor chip is roughened, the surface of the carrier board is also roughened so as to simplify the fabricating process and increase bonding area for a subsequent circuit build-up process.

Referring to FIG. 3A, a carrier board 30 with an opening 300 is provided. The carrier board 30 can be a dielectric board, a metal board or a circuit board of a single-layer or multi-layer structure. The opening 300 can be a through hole penetrating through the carrier board 30. Alternatively, the opening 300 can be a recess without penetrating through the carrier board 30. A semiconductor chip 31 having an active surface 31a and a non-active surface 31b is mounted in the opening 300 of the carrier board 30 with its active surface 31a exposed from the opening 300 of the carrier board 30. Afterwards, different surface roughening processes are performed on the active surface 31a of the semiconductor chip 31 and surface of the carrier board 30, wherein, the surface 311 of the electrode pads 31c is roughened through an oxide process, a brown oxide process or a micro-etch process. The area 312 outside the electrode pads 31c such as passivation layer of the semiconductor chip 31 and the surface 301 of the carrier board 30 are roughened through a plasma etching process, a plasma desmearing process or a reactive ion etching process. Thereby, different rough structures are formed. Of course, the non-active surface 31b of the semiconductor chip 31 can also be roughed if needed.

Referring to FIG. 3B, a circuit build-up structure 32 is formed on surfaces of the carrier board 30 and the active surface 31a of the semiconductor chip 31. The roughened surfaces of the active surface 31a and the carrier board 30 efficiently increase the bonding force between the circuit build-up structure 32 and the active surface 31a, and between the circuit build-up structure 32 and the carrier board 30.

Figure 4:
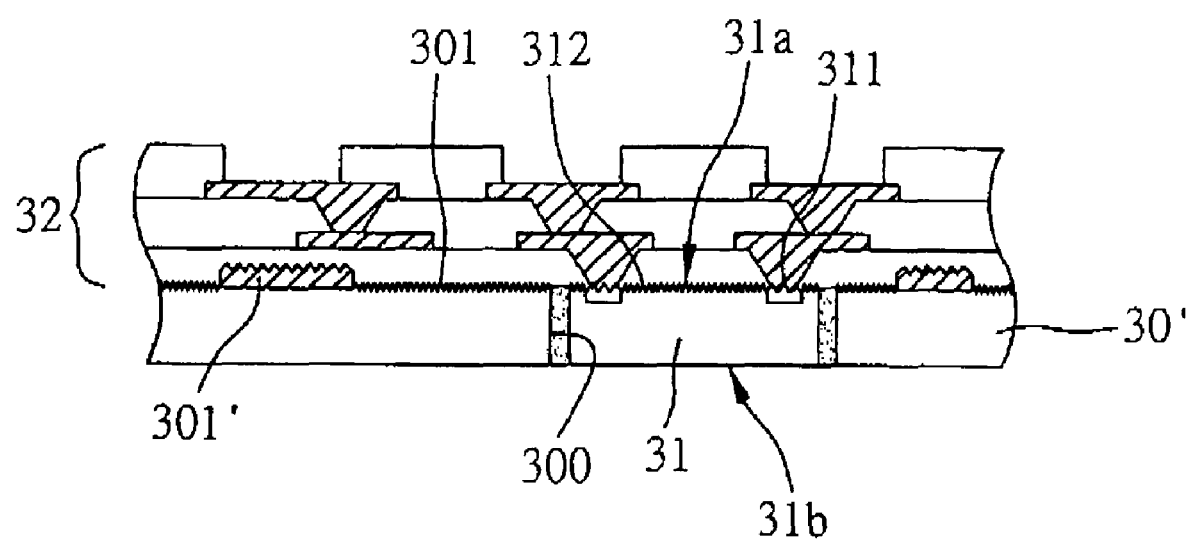
FIG. 4 is a sectional diagram showing a surface roughening method for an embedded semiconductor chip structure according to a third embodiment of the present invention.

Referring to FIG. 4, a surface roughening method according to a third embodiment of the present invention is shown. A circuit board 30' with a circuit layer is used as the carrier board 30. The surface 311 of the electrode pads 31c and the circuit 301' of the circuit board 30' are roughened through an oxide process, a brown oxide process or a micro-etch process. The area 312 outside the electrode pads 31c such as passivation layer of the semiconductor chip 31 and the dielectric surface 301 of the carrier board are roughened through a plasma etching process, a plasma desmearing process or a reactive ion etching process. Thereby, different rough structures are formed so as to form a circuit build-up layer 32 thereon subsequently.

According to the present invention, since both surfaces of the semiconductor chip and the carrier board can be roughened, a large efficient bonding area can be provided for the subsequent circuit build-up process, thereby strengthening the adhesion force of the circuit build-up structure. In addition, because the surface roughening process is performed after the semiconductor chip is stably mounted to the carrier board and the circuit build-up process is performed directly on the rough structure formed in the surface roughening process, conventional problems such as chip surface oxidization, die break and die scratch can be prevented, thereby increasing the fabrication throughput and the product yield.

The above-described descriptions of the detailed embodiments are only to illustrate the preferred implementation according to the present invention, and it is not to limit the scope of the present invention, i.e., other changes still can be implemented in the present invention. For example, for those circuit boards that have very similar component layout, sometimes a single masking board may be used by simply blocking those unwanted openings. Accordingly, all modifications and variations completed by those with ordinary skill in the art should fall within the scope of present invention defined by the appended claims.

What is claimed is:

1. A surface roughening method for an embedded semiconductor chip structure, comprising the steps of:

providing a carrier board with an opening, a semiconductor chip being mounted in the opening of the carrier board, wherein the semiconductor chip has an active surface and a non-active surface opposed to the active surface, and the active surface is exposed from the opening of the carrier board and has a plurality of electrode pads; and performing a surface roughening process on the entire active surface of the semiconductor chip, so as to form a rough structure on the active surface of the semiconductor chip for forming a circuit build-up structure on the rough structure.

2. The method of claim 1, wherein the opening penetrates through the carrier board.

3. The method of claim 1, wherein the opening is provided without penetrating through the carrier board.

4. The method of claim 1, wherein a surface of the carrier board is also roughened during performing the surface roughening process on the surface of the semiconductor chip.

5. The method of claim 2, further comprising performing the surface roughening process on the non-active surface of the semiconductor chip.

6. The method of claim 1, further comprising forming the circuit build-up structure on the roughened surface of the semiconductor chip and the carrier board.

7. The method of claim 4, further comprising forming the circuit build-up structure on the roughened surface of the semiconductor chip and the carrier board.

8. The method of claim 1, wherein the carrier board is one of a circuit board, a metal board and a dielectric board.

9. The method of claim 1, wherein surfaces of the electrode pads are roughened by one of an oxide process, a brown oxide process and a micro-etch process.

10. The method of claim 9, wherein the micro-etch process uses one of an acidic solution, a basic solution and an acidic-basic solution.

11. The method of claim 9, further comprising roughening a surface of a passivation area on the active surface of the semiconductor chip outside the electrode pads of the semiconductor chip by one of a plasma etching process, a plasma desmearing process and a reactive ion etching process.

12. The method of claim 8, wherein a surface of a passivation area on the active surface of the semiconductor chip outside the electrode pads of the semiconductor chip and a surface of the carrier board are roughened by one of a plasma etching process, a plasma desmearing process and a reactive ion etching process.

13. The method of claim 8, wherein surfaces of the electrode pads and a surface of a circuit on the carrier board are roughened by one of an oxide process, a brown oxide process and a micro-etch process.

* * * * *